United States Patent [19]

Apelian

[11] 4,392,006
[45] Jul. 5, 1983

[54] SOLAR CELL ACTIVATION SYSTEM

[76] Inventor: Lawrence Apelian, 51 S. Coleman Rd., Centereach, N.Y. 11720

[21] Appl. No.: 293,280

[22] Filed: Aug. 17, 1981

[51] Int. Cl.³ .......................................... H01L 31/04
[52] U.S. Cl. ................................... 136/246; 136/253; 136/257
[58] Field of Search ................ 136/247, 253, 257, 246

[56] References Cited

U.S. PATENT DOCUMENTS

| | | | |
|---|---|---|---|
| 3,053,927 | 9/1962 | Vislocky | 136/253 |
| 4,009,051 | 2/1977 | Kazis et al. | 320/15 |
| 4,242,147 | 12/1980 | DeToia | 136/253 |
| 4,313,425 | 2/1982 | Crackel et al. | 126/438 |

FOREIGN PATENT DOCUMENTS

| | | | |
|---|---|---|---|
| 54-7291 | 1/1979 | Japan | 136/253 |
| 638106 | 5/1950 | United Kingdom | 136/253 |

*Primary Examiner*—Aaron Weisstuch
*Attorney, Agent, or Firm*—Spellman & Joel

[57] ABSTRACT

A system for activating solar cells involves the use of phosphorescent paint, the light from which is amplified by a thin magnifying lens and used to activate solar cells. In a typical system, a member painted with phosphorescent paint is mounted adjacent a thin magnifying lens which focuses the light on a predetermined array of sensitive cells such as selenium, cadmium or silicon, mounted on a plastic board. A one-sided mirror is mounted adjacent the cells to reflect the light back onto said cells for purposes of further intensification. The cells may be coupled to rechargeable batteries or used to directly power a small radio or watch.

8 Claims, 2 Drawing Figures

U.S. Patent    Jul. 5, 1983    4,392,006

SOLAR CELL ACTIVATION SYSTEM

SUMMARY OF THE INVENTION

This invention comprises a system for activating solar cells without the use of sunlight.

The present invention comprises the use of a phosphorus coating or phosphorescent paint located on a flat member and a thin magnifying lens mounted adjacent thereto in order to focus the light emitted from the flat member onto photo-sensitive selenium cells. Alternatively, photo-sensitive cadmium or silicon cells could be used. The cells are mounted and interconnected in a predetermined array on a plastic board in order to provide the desired output. The sensitive selenium cells are activated by the focussed light from the phosphorescent member and are coupled to a rechargeable battery used to power a small appliance such as a radio or watch. A one-sided mirror is also mounted appropriately with regard to the selenium cells in order to redirect the focussed light back onto the cells.

Accordingly, it is an object of this invention to provide a new and improved system for activating solar cells without the use of sunlight.

Another object of this invention is to provide a new and improved system for efficiently activating solar cells utilizing a light emitting substance.

A more specific object of this invention is to provide a new and improved system for activating solar cells involving focussed and reflected light from a phosphorescent member which is focused on photo-sensitive selenium cells with the output being used to charge rechargeable batteries or directly power a device such as a watch or radio.

BACKGROUND OF THE INVENTION

The present invention relates to a solar cell activation system and particularly to a system for activating solar cells without the use of sunlight.

One of the drawbacks of using solar cells to power devices such as radios, watches, etc., involves the problems arising from the lack of sunlight, particularly at night. While it is possible to store certain amounts of energy in rechargeble batteries, a serious problem arises when the batteries eventually run down due to the lack of sunlight. The present invention in one instance provides a backup system wherein the light from a phosphorescent member is utilized to power or energize solar cells which are coupled to rechargeable batteries. This makes the radio or other device independent of sunlight. More importantly, it is possible to eliminate the necessity of sunlight altogether with magnified light from a light emitting member provided the solar cells are suitably responsive.

No prior art is known in this area and it is believed that the present invention provides a unique advance in the art which will enhance the utilization of self-powered devices.

BRIEF DESCRIPTION OF THE DRAWINGS

Other objects and advantages of the present invention will be more clearly seen when viewed in conjunction with the accompanying drawings wherein.

DETAILED DESCRIPTION OF THE INVENTION

Figure 1:
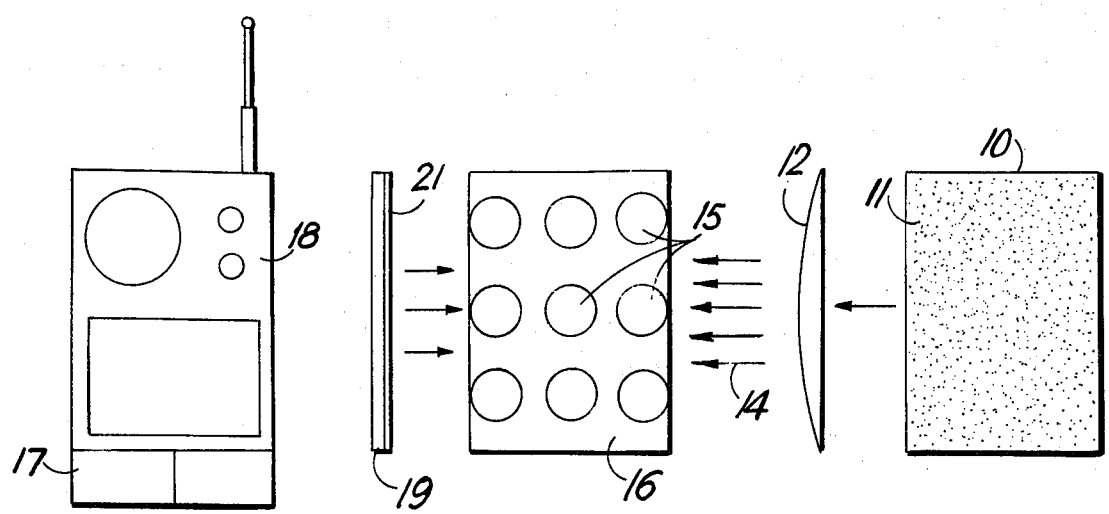
FIG. 1 is a schematic view of a first embodiment to the invention.

Referring now to the drawings, the invention comprises a system for activating solar cells without the use of sunlight. As shown in FIG. 1, the invention involves a flat, substantially rectangular member 10 having a coating of phosphorescent paint 11 located on the upper surface thereof. Alternatively, the member 10 may have a coating of a phosphor or any light emitting substance thereon. The member 10 emits light rays which are focussed by a thin magnifying lens 12 mounted adjacent to said member 10.

The focussed rays 14 from the lens 12 are focused on photo-sensitive solar cells 15 of a material such as selenium, cadmium sulfide or silicon which are mounted in a predetermined array on a plastic board 16. The layout and number of the cells 15 is related to the energy requirements of the device in which the invention is used. More cells are required if a larger device is to be powered or charged from said cells. The cell arrangement is also related to the light emitting member 10 since it is not desired to have more cells 15 than can effectively utilize the emitted light.

The focussed rays 14 from the lens 12 activate the solar cells 15 which are coupled to rechargeable batteries 17 in a radio 18 or similar appliance. In other embodiments, the cells 15 could be used to directly power the radio 18 or could be used to supplement existing sunlight.

A one-sided mirror 19 having reflective surface 21 is mounted on the opposite side of the plastic board 16 particularly if the latter is transparent in order to redirect the rays onto the solar cells 15. If the board 16 is opaque, the mirror may be mounted adjacent to the lens 12 to redirect the emitted light onto the cells 15. Thus it is possible to efficiently power the cells without the use of sunlight in a totally dark environment or alternatively as a backup to the use of sunlight to power the cells. Cells 15 may be on both sides of board 16.

Figure 2:
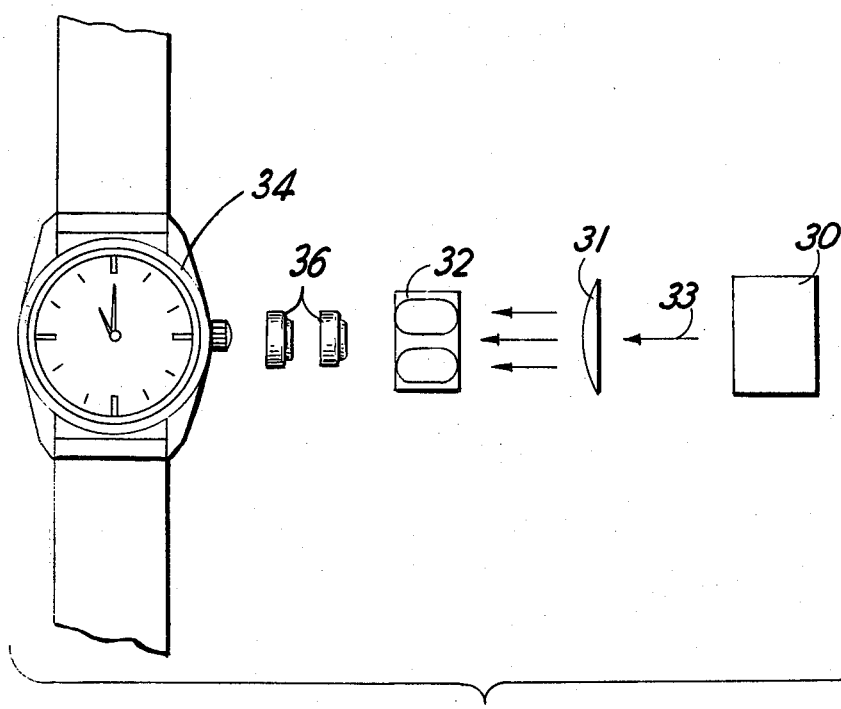
FIG. 2 is a schematic view of a second embodiment of the invention.

FIG. 2 discloses a second embodiment of the invention for use in a watch 34. The invention includes a light emitting rectangular member 30, a thin magnifying lens 31 and solar cells 32 which in this instance are not mounted on any particular board. The elements are mounted so that rays 33 from the phosphorescent member 30 are focussed and directed onto the solar cells 32. The solar cells 32 are coupled to rechargeable batteries 36 and the entire arrangement is suitably mounted within a watch 34.

It is understood that the above-described arrangements are merely illustrative examples of the application. Numerous other arrangements may be readily devised by those skilled in the art which will embody the principles of the invention and fall within the spirit and scope thereof.

I claim:

1. A solar cell activation system comprising:
    a substantially flat board-like transparent member having a coating of a light emitting substance on one surface thereof to emit light rays therefrom,
    a thin magnifying lens mounted adjacent the coated member to focus the light rays emitted from the coated member,
    a substantially flat member having a plurality of solar cells mounted and interconnected thereon and positioned at a predetermined distance from the lens to receive the focused light rays therefrom for purposes of activation, and, a one-sided mirror mounted adjacent the solar cells and on the side opposite the lens to reflect the focussed light passing through said cells back onto said cells and means coupled to the solar cells to receive the output therefrom.

2. A solar cell activation system in accordance with claim 1 wherein:

the means to receive the output of the solar cells comprises a rechargeable battery.

3. A solar cell activation system in accordance with claim 1 wherein:

the solar cells comprise a plurality of sensitive selenium cells and the mounting member comprises a transparent plastic board.

4. A solar cell activation system in accordance with claim 1 wherein:

the mounting member for the solar cells comprises a plastic board and the solar cells are mounted on both sides of said board, and the cells are of cadmium sulfide or silicon.

5. A solar cell activation system in accordance with claim 1 further including:

a device coupled to the solar cells to be driven thereby upon activation of said cells.

6. A solar cell activation system in accordance with claim 1 wherein:

the solar cells are mounted for exposure to sunlight and the coated light emitting board is coupled thereto for activation in the absence of sunlight.

7. A solar cell activation system in accordance with claim 1 wherein:

the light emitting coating on the member comprises a coating of a phosphor.

8. A solar cell activation system in accordance with claim 1 wherein:

the light emitting coating on the member comprises a coating of phosphorescent paint.

* * * * *